United States Patent
Rapport et al.

(10) Patent No.: US 7,256,484 B2
(45) Date of Patent: Aug. 14, 2007

(54) MEMORY EXPANSION AND CHIP SCALE STACKING SYSTEM AND METHOD

(75) Inventors: Russell Rapport, Austin, TX (US); James W. Cady, Austin, TX (US); James Wilder, Austin, TX (US); David L. Roper, Austin, TX (US); James Douglas Wehrly, Jr., Austin, TX (US); Jeff Buchle, Austin, TX (US)

(73) Assignee: Staktek Group L.P., Austin, TX (US)

( * ) Notice: Subject to any disclaimer, the term of this patent is extended or adjusted under 35 U.S.C. 154(b) by 0 days.

(21) Appl. No.: 10/963,867

(22) Filed: Oct. 12, 2004

(65) Prior Publication Data

US 2005/0062144 A1    Mar. 24, 2005

Related U.S. Application Data

(63) Continuation of application No. 10/814,530, filed on Mar. 31, 2004, which is a continuation of application No. 10/453,398, filed on Jun. 3, 2003, which is a continuation-in-part of application No. 10/005,581, filed on Oct. 26, 2001, now Pat. No. 6,576,992.

(51) Int. Cl.
   *H01L 23/02*    (2006.01)
(52) U.S. Cl. ............ 257/686; 257/723; 257/777; 438/109; 365/78
(58) Field of Classification Search ............ 257/685, 257/686, 723, 778, 678, 737–738, 773, 691, 257/E21.645; 361/735–736, 790; 438/106–109, 438/FOR. 212; 365/78
   See application file for complete search history.

(56) References Cited

U.S. PATENT DOCUMENTS

| | | |
|---|---|---|
| 3,411,122 A | 11/1968 | Schiller et al. |
| 3,436,604 A | 4/1969 | Hyltin |
| 3,654,394 A | 4/1972 | Gordon |

(Continued)

FOREIGN PATENT DOCUMENTS

| | | |
|---|---|---|
| DE | 004215467 A1 | 11/1992 |
| DE | 004214102 A1 | 12/1992 |

(Continued)

OTHER PUBLICATIONS

William R. Newberry, Design Techniques for Ball Grid Arrays, Xynetix Design Systems, Inc., Portland, Maine, Published on the Internet.

(Continued)

*Primary Examiner*—Mary Wilczewski
*Assistant Examiner*—Thanh Y. Tran
(74) *Attorney, Agent, or Firm*—Fish & Richardson P.C.

(57) ABSTRACT

The present invention stacks chip scale-packaged integrated circuits (CSPs) into modules that conserve PWB or other board surface area. In another aspect, the invention provides a lower capacitance memory expansion addressing system and method and preferably with the CSP stacked modules provided herein. In a preferred embodiment in accordance with the invention, a form standard is disposed between the flex circuitry and the IC package over which a portion of the flex circuitry is laid. The form standard provides a physical form that allows many of the varying package sizes found in the broad family of CSP packages to be used to advantage while employing a standard connective flex circuitry design. In a preferred embodiment, the form standard will be devised of heat transference material such as copper to improve thermal performance. In a preferred embodiment, a high speed switching system selects a data line associated with each level of a stacked module to reduce the loading effect upon data signals in memory access. This favorably changes the impedance characteristics exhibited by a DIMM board populated with stacked modules. In a preferred embodiment, FET multiplexers for example, under logic control select particular data lines associated with particular levels of stacked modules populated upon a DIMM for connection to a controlling chip set in a memory expansion system.

12 Claims, 9 Drawing Sheets

U.S. PATENT DOCUMENTS

| | | |
|---|---|---|
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 3,983,547 A | 9/1976 | Almasi |
| 4,079,511 A | 3/1978 | Grabbe |
| 4,103,318 A | 7/1978 | Schwede |
| 4,288,841 A | 9/1981 | Gogal |
| 4,398,235 A | 8/1983 | Lutz et al. |
| 4,406,508 A | 9/1983 | Sadigh-Behzadi |
| 4,437,235 A | 3/1984 | McIver |
| 4,513,368 A | 4/1985 | Houseman |
| 4,587,596 A | 5/1986 | Bunnell |
| 4,645,944 A | 2/1987 | Uya |
| 4,696,525 A | 9/1987 | Coller et al. |
| 4,712,129 A | 12/1987 | Orcutt |
| 4,722,691 A | 2/1988 | Gladd et al. |
| 4,733,461 A | 3/1988 | Nakano |
| 4,758,875 A | 7/1988 | Fujisaki et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,862,249 A | 8/1989 | Carlson |
| 4,884,237 A | 11/1989 | Mueller et al. |
| 4,891,789 A | 1/1990 | Quattrini et al. |
| 4,911,643 A | 3/1990 | Perry et al. |
| 4,953,060 A | 8/1990 | Lauffer et al. |
| 4,956,694 A | 9/1990 | Eide |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,034,350 A | 7/1991 | Marchisi |
| 5,041,015 A | 8/1991 | Travis |
| 5,041,902 A | 8/1991 | McShane |
| 5,057,903 A | 10/1991 | Olla |
| 5,064,782 A | 11/1991 | Nishiguchi |
| 5,068,708 A | 11/1991 | Newman |
| 5,081,067 A | 1/1992 | Shimizu et al. |
| 5,099,393 A | 3/1992 | Bentlage et al. |
| 5,104,820 A | 4/1992 | Go, deceased et al. |
| 5,117,282 A | 5/1992 | Salatino |
| 5,122,862 A | 6/1992 | Kajihara et al. |
| 5,138,430 A | 8/1992 | Gow, 3rd et al. |
| 5,138,434 A | 8/1992 | Wood et al. |
| 5,158,912 A | 10/1992 | Kellerman et al. |
| 5,159,434 A | 10/1992 | Kohno et al. |
| 5,159,535 A | 10/1992 | Desai et al. |
| 5,168,926 A | 12/1992 | Watson et al. |
| 5,198,888 A | 3/1993 | Sugano et al. |
| 5,198,965 A | 3/1993 | Curtis et al. |
| 5,214,307 A | 5/1993 | Davis |
| 5,219,794 A | 6/1993 | Satoh et al. |
| 5,222,014 A | 6/1993 | Lin |
| 5,224,023 A | 6/1993 | Smith et al. |
| 5,229,916 A | 7/1993 | Frankeny et al. |
| 5,239,198 A | 8/1993 | Lin et al. |
| 5,240,588 A | 8/1993 | Uchida |
| 5,241,454 A | 8/1993 | Ameen et al. |
| 5,243,133 A | 9/1993 | Engle et al. |
| 5,247,423 A | 9/1993 | Lin et al. |
| 5,252,855 A | 10/1993 | Ogawa et al. |
| 5,252,857 A | 10/1993 | Kane et al. |
| 5,259,770 A | 11/1993 | Bates et al. |
| 5,261,068 A | 11/1993 | Gaskins et al. |
| 5,262,927 A | 11/1993 | Chia et al. |
| 5,276,418 A | 1/1994 | Klosowiak et al. |
| 5,279,029 A | 1/1994 | Burns |
| 5,281,852 A | 1/1994 | Normington |
| 5,289,062 A | 2/1994 | Wyland |
| 5,311,401 A | 5/1994 | Gates, Jr. et al. |
| 5,313,097 A | 5/1994 | Haj-Ali-Ahmadi et al. |
| 5,343,075 A | 8/1994 | Nishino |
| 5,347,428 A | 9/1994 | Carson et al. |
| 5,357,478 A | 10/1994 | Kikuda et al. |
| 5,361,228 A * | 11/1994 | Adachi et al. .......... 365/189.03 |
| 5,375,041 A | 12/1994 | McMahon |
| 5,377,077 A | 12/1994 | Burns |
| 5,386,341 A | 1/1995 | Olson et al. |
| 5,394,010 A | 2/1995 | Tazawa et al. |
| 5,394,303 A | 2/1995 | Yamaji |
| 5,397,916 A | 3/1995 | Normington |
| 5,402,006 A | 3/1995 | O'Donley |
| 5,420,751 A | 5/1995 | Burns |
| 5,428,190 A | 6/1995 | Stopperan |
| 5,438,224 A | 8/1995 | Papageorge et al. |
| 5,446,620 A | 8/1995 | Burns et al. |
| 5,448,511 A | 9/1995 | Paurus et al. |
| 5,455,740 A | 10/1995 | Burns |
| 5,475,920 A | 12/1995 | Burns et al. |
| 5,477,082 A | 12/1995 | Buckley, III et al. |
| 5,479,318 A | 12/1995 | Burns |
| 5,484,959 A | 1/1996 | Burns |
| 5,493,476 A | 2/1996 | Burns |
| 5,499,160 A | 3/1996 | Burns |
| 5,502,333 A * | 3/1996 | Bertin et al. ............... 257/685 |
| 5,514,907 A | 5/1996 | Moshayedi |
| 5,523,619 A | 6/1996 | McAllister et al. |
| 5,523,695 A | 6/1996 | Lin |
| 5,541,812 A | 7/1996 | Burns |
| 5,543,664 A | 8/1996 | Burns |
| 5,561,591 A | 10/1996 | Burns |
| 5,566,051 A | 10/1996 | Burns |
| 5,572,065 A | 11/1996 | Burns |
| 5,588,205 A | 12/1996 | Roane |
| 5,592,364 A | 1/1997 | Roane |
| 5,594,275 A | 1/1997 | Kwon et al. |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner, Jr. et al. |
| 5,654,877 A | 8/1997 | Burns |
| 5,657,537 A | 8/1997 | Saia et al. |
| 5,677,569 A | 10/1997 | Choi et al. |
| 5,729,894 A | 3/1998 | Rostoker et al. |
| 5,744,827 A | 4/1998 | Jeong et al. |
| 5,751,553 A | 5/1998 | Clayton |
| 5,763,296 A | 6/1998 | Casati et al. |
| 5,764,497 A | 6/1998 | Mizumo et al. |
| 5,776,797 A | 7/1998 | Nicewarner, Jr. et al. |
| 5,778,522 A | 7/1998 | Burns |
| 5,783,464 A | 7/1998 | Burns |
| 5,789,815 A | 8/1998 | Tessier et al. |
| 5,801,437 A | 9/1998 | Burns |
| 5,801,439 A | 9/1998 | Fujisawa et al. |
| 5,804,870 A | 9/1998 | Burns |
| 5,805,422 A | 9/1998 | Otake et al. |
| 5,828,125 A | 10/1998 | Burns |
| 5,835,988 A | 11/1998 | Ishii |
| 5,841,721 A * | 11/1998 | Kwon et al. ............... 365/218 |
| 5,869,353 A | 2/1999 | Levy et al. |
| 5,895,970 A | 4/1999 | Miyoshi |
| 5,899,705 A | 5/1999 | Akram |
| 5,917,709 A | 6/1999 | Johnson et al. |
| 5,922,061 A | 7/1999 | Robinson |
| 5,925,934 A | 7/1999 | Lim |
| 5,926,369 A | 7/1999 | Ingraham et al. |
| 5,949,657 A | 9/1999 | Karabatsos |
| 5,953,215 A | 9/1999 | Karabatsos |
| 5,959,839 A | 9/1999 | Gates |
| 5,963,427 A | 10/1999 | Bollesen |

| | | | | | | |
|---|---|---|---|---|---|---|
| 5,973,395 | A | 10/1999 | Suzuki et al. | 6,590,282 B1 | 7/2003 | Wang et al. |
| 5,995,370 | A | 11/1999 | Nakamori | 6,600,222 B1 | 7/2003 | Levardo |
| 6,002,167 | A | 12/1999 | Hatano et al. | 6,614,664 B2 | 9/2003 | Lee |
| 6,002,589 | A | 12/1999 | Perino et al. | 6,620,651 B2 | 9/2003 | He et al. |
| 6,014,316 | A | 1/2000 | Eide | 6,627,984 B2 | 9/2003 | Bruce et al. |
| 6,025,642 | A | 2/2000 | Burns | 6,657,134 B2 | 12/2003 | Spielberger et al. |
| 6,028,352 | A | 2/2000 | Eide | 6,660,561 B2 | 12/2003 | Forthun |
| 6,028,365 | A | 2/2000 | Akram et al. | 6,677,670 B2 | 1/2004 | Kondo |
| 6,034,878 | A | 3/2000 | Osaka et al. | 6,683,377 B1 | 1/2004 | Shim et al. |
| 6,040,624 | A | 3/2000 | Chambers et al. | 6,690,584 B2 * | 2/2004 | Uzuka et al. ................ 361/796 |
| 6,072,233 | A | 6/2000 | Corisis et al. | 6,699,730 B2 | 3/2004 | Kim et al. |
| 6,084,293 | A | 7/2000 | Ohuchi | 6,707,684 B1 | 3/2004 | Andric et al. |
| 6,084,294 | A | 7/2000 | Tomita | 6,709,893 B2 | 3/2004 | Moden et al. |
| 6,097,087 | A | 8/2000 | Farnworth et al. | 6,768,660 B2 | 7/2004 | Kong et al. |
| 6,121,676 | A | 9/2000 | Solberg | 6,781,240 B2 | 8/2004 | Choi et al. |
| RE36,916 | E | 10/2000 | Moshayedi | 6,803,651 B1 | 10/2004 | Chiang |
| 6,157,541 | A | 12/2000 | Hacke | 6,812,567 B2 | 11/2004 | Kim et al. |
| 6,165,817 | A | 12/2000 | Akram et al. | 6,833,984 B1 | 12/2004 | Belgacem |
| 6,172,874 | B1 | 1/2001 | Bartilson | 6,849,949 B1 | 2/2005 | Lyu et al. |
| 6,178,093 | B1 | 1/2001 | Bhatt et al. | 6,876,074 B2 | 4/2005 | Kim |
| 6,187,652 | B1 | 2/2001 | Chou et al. | 6,884,653 B2 | 4/2005 | Larson |
| 6,205,654 | B1 | 3/2001 | Burns | 6,891,729 B2 | 5/2005 | Ko et al. |
| 6,208,521 | B1 | 3/2001 | Nakatsuka | 6,908,792 B2 | 6/2005 | Bruce et al. |
| 6,222,737 | B1 | 4/2001 | Ross | 6,914,324 B2 | 7/2005 | Rapport et al. |
| 6,225,688 | B1 | 5/2001 | Kim et al. | 6,919,626 B2 | 7/2005 | Burns |
| 6,233,650 | B1 | 5/2001 | Johnson et al. | 2001/0006252 A1 | 7/2001 | Kim et al. |
| 6,234,820 | B1 | 5/2001 | Perino et al. | 2001/0013423 A1 | 8/2001 | Dalal et al. |
| 6,262,476 | B1 | 7/2001 | Vidal | 2001/0015487 A1 | 8/2001 | Forthun |
| 6,262,895 | B1 | 7/2001 | Forthun | 2001/0035572 A1 | 11/2001 | Isaak |
| 6,265,660 | B1 | 7/2001 | Tandy | 2001/0040793 A1 | 11/2001 | Inaba |
| 6,266,252 | B1 | 7/2001 | Karabatsos | 2002/0006032 A1 | 1/2002 | Karabatsos |
| 6,281,577 | B1 | 8/2001 | Oppermann et al. | 2002/0030995 A1 | 3/2002 | Shoji |
| 6,285,560 | B1 | 9/2001 | Lyne | 2002/0048849 A1 | 4/2002 | Isaak |
| 6,288,907 | B1 | 9/2001 | Burns | 2002/0076919 A1 | 6/2002 | Peters et al. |
| 6,300,679 | B1 * | 10/2001 | Mukerji et al. ............. 257/738 | 2002/0101261 A1 | 8/2002 | Karabatsos |
| 6,303,981 | B1 | 10/2001 | Moden | 2002/0139577 A1 | 10/2002 | Miller |
| 6,310,392 | B1 | 10/2001 | Burns | 2002/0164838 A1 | 11/2002 | Moon et al. |
| 6,313,998 | B1 | 11/2001 | Kledzik | 2002/0180022 A1 | 12/2002 | Emoto |
| 6,316,825 | B1 | 11/2001 | Park et al. | 2003/0016710 A1 | 1/2003 | Kamoto |
| 6,323,060 | B1 | 11/2001 | Isaak | 2003/0045025 A1 | 3/2003 | Coyle et al. |
| 6,329,708 | B1 | 12/2001 | Komiyama | 2003/0049886 A1 | 3/2003 | Salmon |
| 6,336,262 | B1 | 1/2002 | Dalal et al. | 2003/0081392 A1 | 5/2003 | Cady et al. |
| 6,351,029 | B1 | 2/2002 | Isaak | 2003/0107118 A1 | 6/2003 | Pflughaupt et al. |
| 6,360,433 | B1 | 3/2002 | Ross | 2003/0109078 A1 | 6/2003 | Takahashi et al. |
| 6,368,896 | B2 | 4/2002 | Farnworth et al. | 2003/0168725 A1 | 9/2003 | Warner et al. |
| 6,376,769 | B1 | 4/2002 | Chung | 2004/0000708 A1 | 1/2004 | Rapport et al. |
| 6,392,162 | B1 | 5/2002 | Karabatsos | 2004/0021211 A1 | 2/2004 | Damberg |
| 6,410,857 | B1 | 6/2002 | Gonya | 2004/0031972 A1 | 2/2004 | Pflughaupt et al. |
| 6,426,240 | B2 | 7/2002 | Isaak | 2004/0045159 A1 | 3/2004 | DiStefano et al. |
| 6,426,549 | B1 | 7/2002 | Isaak | 2004/0065963 A1 | 4/2004 | Kamezos |
| 6,426,560 | B1 | 7/2002 | Kawamura et al. | 2004/0075991 A1 | 4/2004 | Haba et al. |
| 6,433,418 | B1 | 8/2002 | Fujisawa et al. | 2004/0099938 A1 | 5/2004 | Kang et al. |
| 6,444,490 | B2 | 9/2002 | Bertin et al. | 2004/0104470 A1 | 6/2004 | Bang et al. |
| 6,444,921 | B1 | 9/2002 | Wang et al. | 2004/0115866 A1 | 6/2004 | Bang et al. |
| 6,446,158 | B1 | 9/2002 | Karabatsos | 2004/0150107 A1 | 8/2004 | Cha et al. |
| 6,449,159 | B1 | 9/2002 | Haba | 2004/0157352 A1 | 8/2004 | Beroz et al. |
| 6,452,826 | B1 | 9/2002 | Kim et al. | 2004/0203190 A1 | 10/2004 | Pflughaupt et al. |
| 6,462,412 | B2 | 10/2002 | Kamei et al. | 2004/0217461 A1 | 11/2004 | Damberg |
| 6,465,877 | B1 | 10/2002 | Farnworth et al. | 2004/0217471 A1 | 11/2004 | Haba |
| 6,465,893 | B1 | 10/2002 | Khandros et al. | 2004/0238931 A1 | 12/2004 | Haba et al. |
| 6,473,308 | B2 | 10/2002 | Forthun | 2004/0245617 A1 | 12/2004 | Damberg et al. |
| 6,486,544 | B1 | 11/2002 | Hashimoto | 2005/0018495 A1 | 1/2005 | Bhakta et al. |
| 6,489,178 | B2 | 12/2002 | Coyle et al. | 2005/0035440 A1 | 2/2005 | Mohammed |
| 6,489,687 | B1 | 12/2002 | Hashimoto | 2005/0040508 A1 | 2/2005 | Lee |
| 6,492,718 | B2 | 12/2002 | Ohmori | 2005/0133897 A1 | 6/2005 | Baek et al. |
| 6,509,639 | B1 | 1/2003 | Lin | | | |
| 6,514,793 | B2 | 2/2003 | Isaak | | | |
| 6,528,870 | B2 | 3/2003 | Fukatsu et al. | | | |
| 6,552,910 | B1 | 4/2003 | Moon et al. | EP | 0426-303 A2 | 10/1990 |
| 6,560,117 | B2 | 5/2003 | Moon | EP | 461-639 A | 12/1991 |
| 6,572,387 | B2 | 6/2003 | Burns et al. | JP | 359088863 A | 5/1984 |
| 6,576,992 | B1 | 6/2003 | Cady et al. | JP | 60-254762 A | 12/1985 |
| 6,588,095 | B2 | 7/2003 | Pan | JP | 3641047659 A | 3/1986 |

FOREIGN PATENT DOCUMENTS

| | | |
|---|---|---|
| JP | 62-230027 A | 8/1987 |
| JP | 4-209562 A | 7/1992 |
| JP | 404368167 A | 12/1992 |
| JP | 5029534 A | 2/1993 |
| JP | 63-153849 A | 6/1998 |
| JP | 2000/307029 A | 11/2000 |
| JP | 2001077294 A | 3/2001 |
| JP | 2001085592 A | 3/2001 |
| JP | 2001332683 A | 11/2001 |
| JP | 2003037246 A | 2/2003 |
| JP | 2003086760 A | 3/2003 |
| JP | 2003086761 A | 3/2003 |
| JP | 2003/309247 A | 10/2003 |
| JP | 2003309246 A | 10/2003 |
| JP | 2003/347475 A | 12/2003 |
| JP | 2003/347503 A | 12/2003 |
| WO | WO 03/037053 A1 | 5/2003 |

OTHER PUBLICATIONS

Tessera Technologies, Inc.—Semiconductor Intellectual Property, Chip Scale Packaging—Website pages (3), Published on Internet.
Tessera Introduces uZ ä—Ball Stacked Memory Package for Computing and Portable Electronic Products, Oyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002, San Jose, CA.
Ron Bauer, Intel. "Stacked-CSP Delivers Flexibility, Reliability, and Space-Saving Capabilities", Spring 2002, Published on the Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Webiste 9 pages) Fjelstad, Joseph, Pacific Consultants L.LC., Published Jan. 2001 on Internet.
Flexible Thinking: Examining the Flexible Circuit Tapes. (Website 2 pages) Fjelstad, Joseph., Published Apr. 20, 2000 on Internet.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Flexible Printed Circuit Technology—A Versatile Interconnection Option. (Website 2 pages) Fjelstad, Joseph. Dec. 3, 2002.
Chip Scale Packaging and Redistribution, Paul A. Magill, Glenn A. Rinne, J. Daniel Mis, Wayne C. Machon, Joseph W. Baggs, Unitive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512K X 16 CMOS SRAM Module.
IBM Preliminary 168 Pin SDRAM Registered DIMM Functional Description & Timing Diagrams.
3D Interconnection for Ultra-Dense Multichip Modules, Christian VAL, Thomson-CSF DCS Computer Division, Thierry Lemoine, Thomson-CSF RCM Radar Countermeasures Division.
High Density Memory Packaging Technology High Speed Imaging Applications, Dean Frew, Texas Instruments Incorporated.
Vertically-Intergrated Package, Alvin Weinberg, Pacesetter, Inc. and W. Kinzy Jones, Florida International University.
1992 Proceedings, 42nd Electronic Components & Technology Conference, May 18-20, 1992.
Research Disclosure, Organic Card Device Carrier, 31318, May 1990, No. 313.
IBM Technical Disclosure Bulletin, vol. 23, No. 12, May 1981.
IBM Technical Disclosure Bulletin, vol. 20, No. 11A, Apr. 1978.
IBM Technical Disclosure Bulletin, vol. 32, No. 3B, Aug. 1989.
Orthogonal Chip Mount—A 3D Hybrid Wafer Scale Integration Technology, International Electron Device Meeting, IEDM Technical Digest, Washington, D.C., Dec. 6-9, 1987.
Search Report and Written Opinion; mailed Oct. 17, 2006; PCT/US2006/017015.

* cited by examiner

MEMORY EXPANSION AND CHIP SCALE STACKING SYSTEM AND METHOD

RELATED APPLICATIONS

This application is a continuation of U.S. patent application Ser. No. 10/814,530, filed Mar. 31, 2004, pending, which is a continuation of U.S. patent application Ser. No. 10/453,398, filed Jun. 3, 2003, pending, which is a continuation-in-part of U.S. patent application Ser. No. 10/005,581, filed Oct. 26, 2001, now U.S. Pat. No. 6,576,992. U.S. patent application Ser. Nos. 10/814,530, 10/005,581 and 10/453,398 are incorporated by reference for all purposes.

TECHNICAL FIELD

The present invention relates to aggregating integrated circuits and, in particular, to stacking integrated circuits in chip-scale packages and providing such stacked integrated circuits on boards.

BACKGROUND OF THE INVENTION

A variety of techniques are used to stack packaged integrated circuits. Some methods require special packages, while other techniques stack conventional packages. In some stacks, the leads of the packaged integrated circuits are used to create a stack, while in other systems, added structures such as rails provide all or part of the interconnection between packages. In still other techniques, flexible conductors with certain characteristics are used to selectively interconnect packaged integrated circuits.

The predominant package configuration employed during the past decade has encapsulated an integrated circuit (IC) in a plastic surround typically having a rectangular configuration. The enveloped integrated circuit is connected to the application environment through leads emergent from the edge periphery of the plastic encapsulation. Such "leaded packages" have been the constituent elements most commonly employed by techniques for stacking packaged integrated circuits.

Leaded packages play an important role in electronics, but efforts to miniaturize electronic components and assemblies have driven development of technologies that preserve circuit board surface area. Because leaded packages have leads emergent from peripheral sides of the package, leaded packages occupy more than a minimal amount of circuit board surface area. Consequently, alternatives to leaded packages known as chip scale packaging or "CSP" have recently gained market share.

CSP refers generally to packages that provide connection to an integrated circuit through a set of contacts (often embodied as "bumps" or "balls") arrayed across a major surface of the package. Instead of leads emergent from a peripheral side of the package, contacts are placed on a major surface and typically emerge from the planar bottom surface of the package.

The goal of CSP is to occupy as little area as possible and, preferably, approximately the area of the encapsulated IC. Therefore, CSP leads or contacts do not typically extend beyond the outline perimeter of the package. The absence of "leads" on package sides renders most stacking techniques devised for leaded packages inapplicable for CSP stacking.

The previous known methods for stacking CSPs typically present complex structural arrangements and thermal or high frequency performance issues. For example, thermal performance is a characteristic of importance in CSP stacks. To increase dissipation of heat generated by constituent CSPs and the module, the thermal gradient between the lower CSP and upper CSP in a CSP stack or module should be minimized.

Memory expansion is one of the many fields in which stacked module solutions provide advantages. For example, the well-known DIMM board is frequently populated with stacked modules from those such as the assignee of the present invention. This adds capacity to the board without adding sockets.

A memory expansion board such as a DIMM, for example, provides plural sites for memory IC placement (i.e., sockets) arranged along both major surfaces of a board having an array of contacts dispersed along at least one board edge. Although stacking reduces interconnect length per unit of memory, and thus takes advantage of the general rule that interconnects that are less than half the spatial extent of the leading edge of a signal operate as a lumped element more than a transmission line, it does increase the raw number of devices on a DIMM board. Consequently, despite the reduction in interconnect length per unit of memory, signals accessing data stored in memory circuits physically placed on the DIMM board are typically presented with relatively high impedance as the number of devices on the bus is increased by stacking.

What is needed, therefore, is a technique and system for stacking CSPs that provides a thermally efficient, reliable structure that performs well at higher frequencies but does not add excessive height to the stack yet allows production at reasonable cost with readily understood and managed materials and methods and allows significant reductions in interconnect lengths and/or loading when employed in memory expansion boards and design.

SUMMARY OF THE INVENTION

The present invention stacks chip scale-packaged integrated circuits (CSPs) into modules that conserve PWB or other board surface area. In another aspect, the invention provides a lower capacitance memory expansion addressing system and method and preferably with the CSP stacked modules provided herein. Although the present invention is applied most frequently to chip scale packages that contain one die, it may be employed with chip scale packages that include more than one integrated circuit die.

Multiple numbers of CSPs may be stacked in accordance with the present invention. A four-high CSP stacked module is preferred for use with the disclosed high performance memory access system while, for many applications, a two-high CSP stack or module devised in accordance with a preferred embodiment of the present invention is preferred. The CSPs employed in stacked modules devised in accordance with the present invention are connected with flex circuitry. That flex circuitry may exhibit one or two or more conductive layers with preferred embodiments having two conductive layers.

The flex circuitry is partially wrapped above a form standard. A form standard is disposed between the flex circuitry and the IC package over which a portion of the flex circuitry is laid. The form standard can take many configurations and may be used where flex circuits are used to connect CSPs to one another in stacked modules having two or more constituent ICs. For example, in stacked modules that include four CSPs, three form standards are employed in preferred embodiments, although fewer may be used. The form standard provides a physical form that allows many of the varying package sizes found in the broad family of CSP packages to be used to advantage while employing a standard connective flex circuitry design. In a preferred embodiment, the form standard will be devised of heat transference material, a metal for example, such as copper would be preferred, to improve thermal performance.

In a preferred embodiment of the present invention, four-high stacked CSP modules are disposed on a memory expansion boards in accordance with the memory expansion system and methods of the present invention which may be employed with CSP or other IC stacked modules. A high speed switching system selects a data line associated with each level of a stacked module to reduce the loading effect upon data signals in memory access. This favorably changes the impedance characteristics exhibited by the board loading. The high speed DQ selection switch may be implemented, in a preferred embodiment, for example, with a high speed FET switch. FET multiplexers for example, under logic control select particular data lines associated with particular levels of the DIMM-populated stacked modules for connection to a controlling chip set in a memory expansion system in accordance with a preferred embodiment.

DESCRIPTION OF PREFERRED EMBODIMENTS

Figure 1:
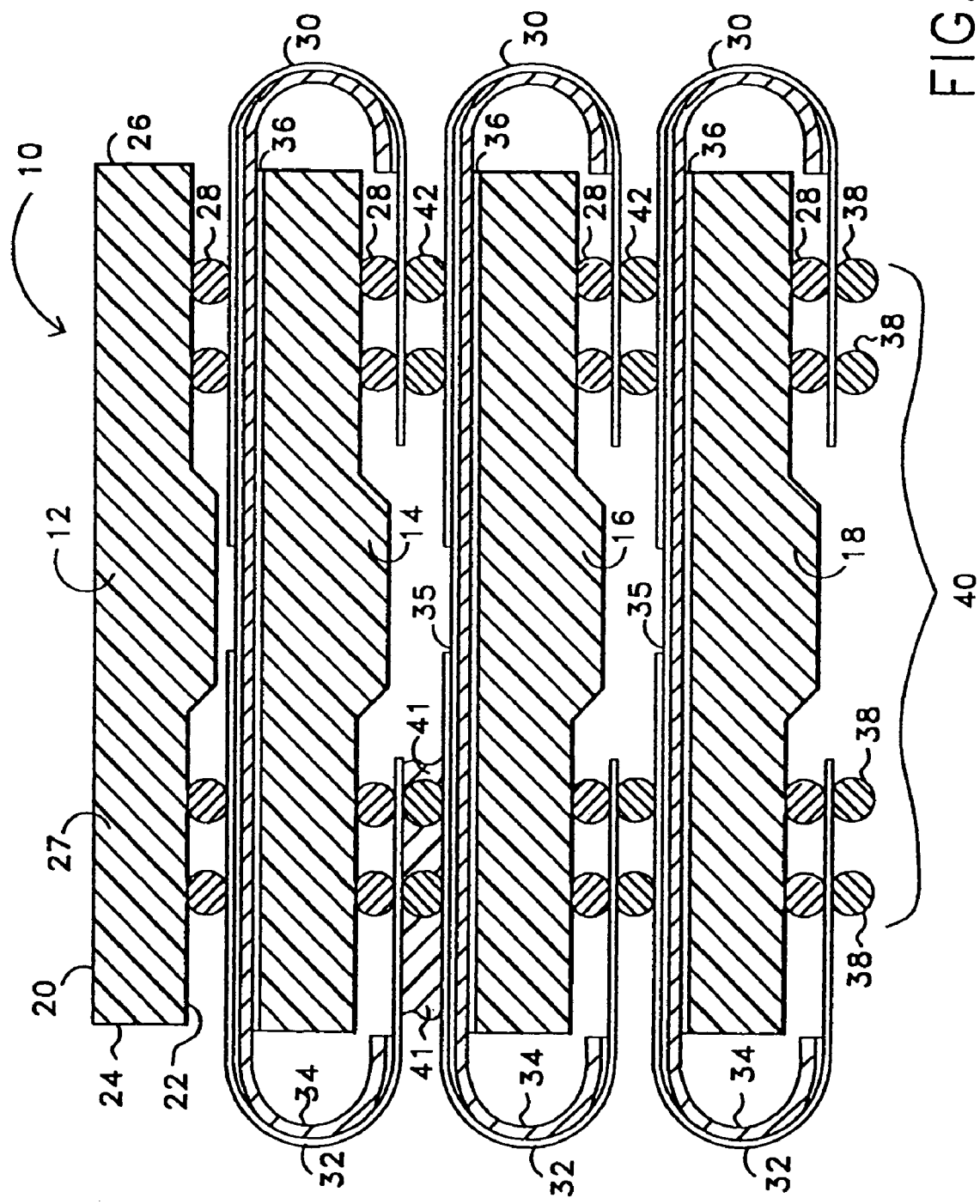
FIG. 1 is an elevation view of a high-density circuit module devised in accordance with a preferred four-high embodiment of the present invention.

FIG. 1 is an elevation view of module 10 devised in accordance with a preferred embodiment of the present invention. Module 10 is comprised of four CSPs: level four CSP 12, level three CSP 14, level two CSP 16, and level one CSP 18. Each of the CSPs has an upper surface 20 and a lower surface 22 and opposite lateral edges 24 and 26 and typically include at least one integrated circuit surrounded by a plastic body 27. The body need not be plastic, but a large majority of packages in CSP technologies are plastic. Those of skill will realize that the present invention may be devised to create modules with different size CSPs and that the constituent CSPs may be of different types within the same module 10. For example, one of the constituent CSPs may be a typical CSP having lateral edges 24 and 26 that have an appreciable height to present a "side" while other constituent CSPs of the same module 10 may be devised in packages that have lateral edges 24 and 26 that are more in the character of an edge rather than a side having appreciable height.

Figure 2:
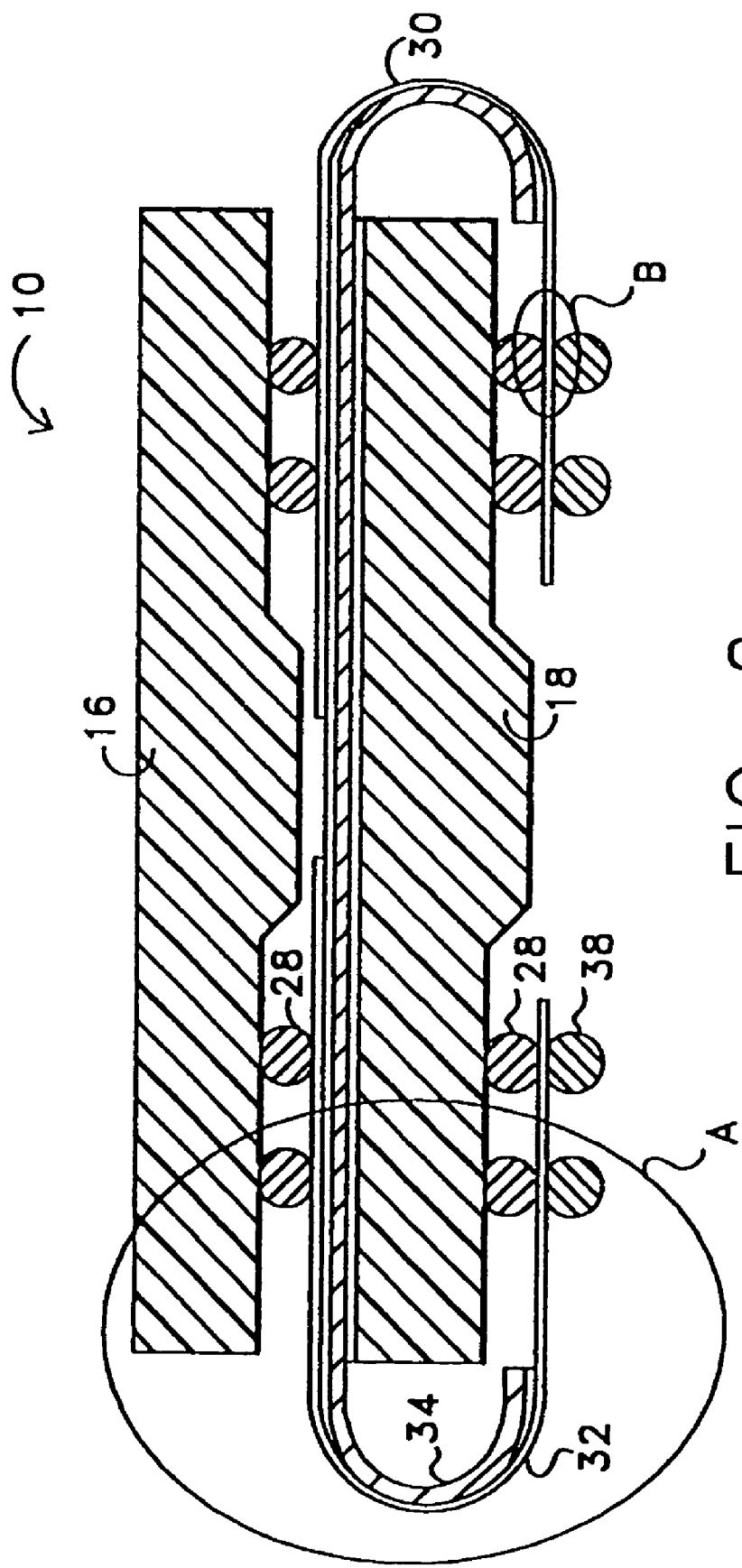
FIG. 2 is an elevation view of a stacked high-density circuit module devised in accordance with a preferred two-high embodiment of the present invention.

The invention is used with CSP packages of a variety of types and configurations such as, for example, those that are die-sized, as well those that are near chip-scale as well as the variety of ball grid array packages known in the art. It may also be used with those CSP-like packages that exhibit bare die connectives on one major surface. Thus, the term CSP should be broadly considered in the context of this application. Collectively, these will be known herein as chip scale packaged integrated circuits (CSPs) and preferred embodiments will be described in terms of CSPs, but the particular configurations used in the explanatory figures are not, however, to be construed as limiting. For example, the elevation views of FIGS. 1 and 2 are depicted with CSPs of a particular profile known to those in the art, but it should be understood that the figures are exemplary only. The invention may be employed to advantage in the wide range of CSP configurations available in the art where an array of connective elements is available from at least one major surface. The invention is advantageously employed with CSPs that contain memory circuits, but may be employed to advantage with logic and computing circuits where added capacity without commensurate PWB or other board surface area consumption is desired.

Typical CSPs, such as, for example, ball-grid-array ("BGA"), micro-ball-grid array, and fine-pitch ball grid array ("FBGA") packages have an array of connective contacts embodied, for example, as leads, bumps, solder balls, or balls that extend from lower surface 22 of a plastic casing in any of several patterns and pitches. An external portion of the connective contacts is often finished with a ball of solder. Shown in FIG. 1 are contacts 28 along lower surfaces 22 of the illustrated constituent CSPs 12, 14, 16, and 18. Contacts 28 provide connection to the integrated circuit or circuits within the respective packages. In embodiments of the present invention, module 10 may be devised to present a lower profile by stripping from the respective CSPs, the balls depicted in FIG. 1 as contacts 28 and providing a connection facility at contact 28 that results from solder paste that is applied either to the pad contact of the CSP that is typically present under or within the typical ball contacts provided on CSP devices or to the contact sites on the flex circuitry to be connected to contact 28.

In FIG. 1, iterations of flex circuits ("flex", "flex circuits" or "flexible circuit structures") 30 and 32 are shown connecting various constituent CSPs. Any flexible or conformable substrate with an internal layer connectivity capability may be used as a flex circuit in the invention. The entire flex circuit may be flexible or, as those of skill in the art will recognize, a PCB structure made flexible in certain areas to allow conformability around CSPs and rigid in other areas for planarity along CSP surfaces may be employed as an alternative flex circuit in the present invention. For example, structures known as rigid-flex may be employed.

Form standard 34 is shown disposed adjacent to upper surface 20 of each of the CSPs below level four CSP 12. Form standard 34 may be fixed to upper surface 20 of the respective CSP with an adhesive 36 which preferably is thermally conductive. Form standard 34 may also, in alternative embodiments, merely lay on upper surface 20 or be separated from upper surface 20 by an air gap or medium such as a thermal slug or non-thermal layer. However, where form standard 34 is a thermally conductive material such as the copper that is employed in a preferred embodiment, layers or gaps interposed between form standard 34 and the respective CSP (other than thermally conductive layers such as adhesive) are not highly preferred.

Form standard 34 is, in a preferred embodiment, devised from copper to create, as shown in the depicted preferred embodiment of FIG. 1, a mandrel that mitigates thermal accumulation while providing a standard sized form about which flex circuitry is disposed. Form standard 34 may take other shapes and forms such as for example, an angular "cap" that rests upon the respective CSP body. It also need not be thermally enhancing although such attributes are preferable. The form standard 34 allows the invention to be employed with CSPs of varying sizes, while articulating a single set of connective structures useable with the varying sizes of CSPs. Thus, a single set of connective structures such as flex circuits 30 and 32 (or a single flexible circuit in the mode where a single flex is used in place of the flex circuit pair 30 and 32) may be devised and used with the form standard 34 method and/or systems disclosed herein to create stacked modules with CSPs having different sized packages. This will allow the same flexible circuitry set design to be employed to create iterations of a stacked module 10 from constituent CSPs having a first arbitrary dimension X across attribute Y (where Y may be, for example, package width), as well as modules 10 from constituent CSPs having a second arbitrary dimension X prime across that same attribute Y. Thus, CSPs of different sizes may be stacked into modules 10 with the same set of connective structures (i.e. flex circuitry). Further, as those of skill will recognize, mixed sizes of CSPs may be implemented into the same module 10, such as would be useful to implement embodiments of a system-on-a-stack such as those disclosed in co-pending application U.S. patent application Ser. No. 10/136,890, filed May 2, 2002, which is hereby incorporated by reference and commonly owned by the assignee of the present application.

Preferably, portions of flex circuits 30 and 32 are fixed to form standard 34 by adhesive 35 which is preferably a tape adhesive, but may be a liquid adhesive or may be placed in discrete locations across the package. Preferably, adhesive 35 is thermally conductive.

In a preferred embodiment, flex circuits 30 and 32 are multi-layer flexible circuit structures that have at least two conductive layers examples of which are those described in U.S. application Ser. No. 10/005,581 which has been incorporated by reference herein. Other embodiments may, however, employ flex circuitry, either as one circuit or two flex circuits to connect a pair of CSPs, that have only a single conductive layer.

Preferably, the conductive layers are metal such as alloy 110. The use of plural conductive layers provides advantages and the creation of a distributed capacitance across module 10 intended to reduce noise or bounce effects that can, particularly at higher frequencies, degrade signal integrity, as those of skill in the art will recognize. Module 10 of FIG. 1 has plural module contacts 38 collectively identified as module array 40. Connections between flex circuits are shown as being implemented with inter-flex contacts 42 which are shown as balls but may be low profile contacts constructed with pads and/or rings that are connected with solder paste applications to appropriate connections. Appropriate fills such as those indicated by conformal media reference 41 can provide added structural stability and coplanarity where desired. Media 41 is shown only as to CSPs 14 and 16 and only on one side to preserve clarity of view.

FIG. 2 shows a two-high module 10 devised in accordance with a preferred embodiment of the invention. FIG. 2 has an area marked "A" that is subsequently shown in enlarged depiction in FIG. 3 and an enlarged area marked "B" that is shown subsequently in enlarged depiction in FIG. 4.

Figure 3:
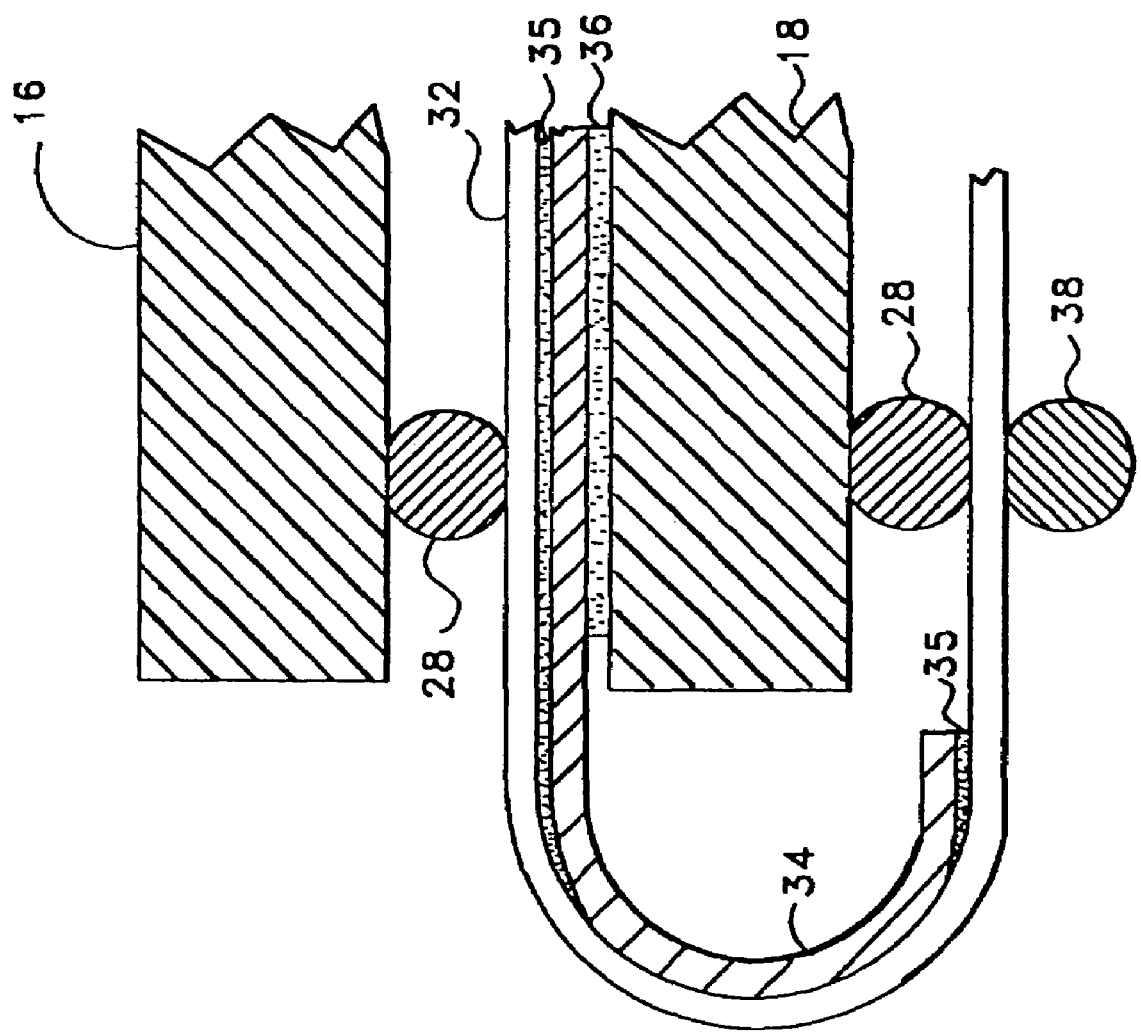
FIG. 3 depicts, in enlarged view, the area marked "A" in FIG. 2.

FIG. 3 depicts in enlarged view, the area marked "A" in FIG. 2. FIG. 3 illustrates in a preferred embodiment, one arrangement of a form standard 34 and its relation to flex circuitry 32 in a two-high module 10. The internal layer constructions of flex circuitry 32 are not shown in this figure. Also shown are adhesives 35 between flex circuit 32 and form standard 34. Those of skill will note that adhesive 35 is not required but is preferred and the site of its application may be determined as being best in the area between CSPs with a smaller amount near the terminal point of form standard 34 as shown in FIG. 3. Also shown in FIG. 3 is an application of adhesive 36 between form standard 34 and CSP 18.

Figure 4:
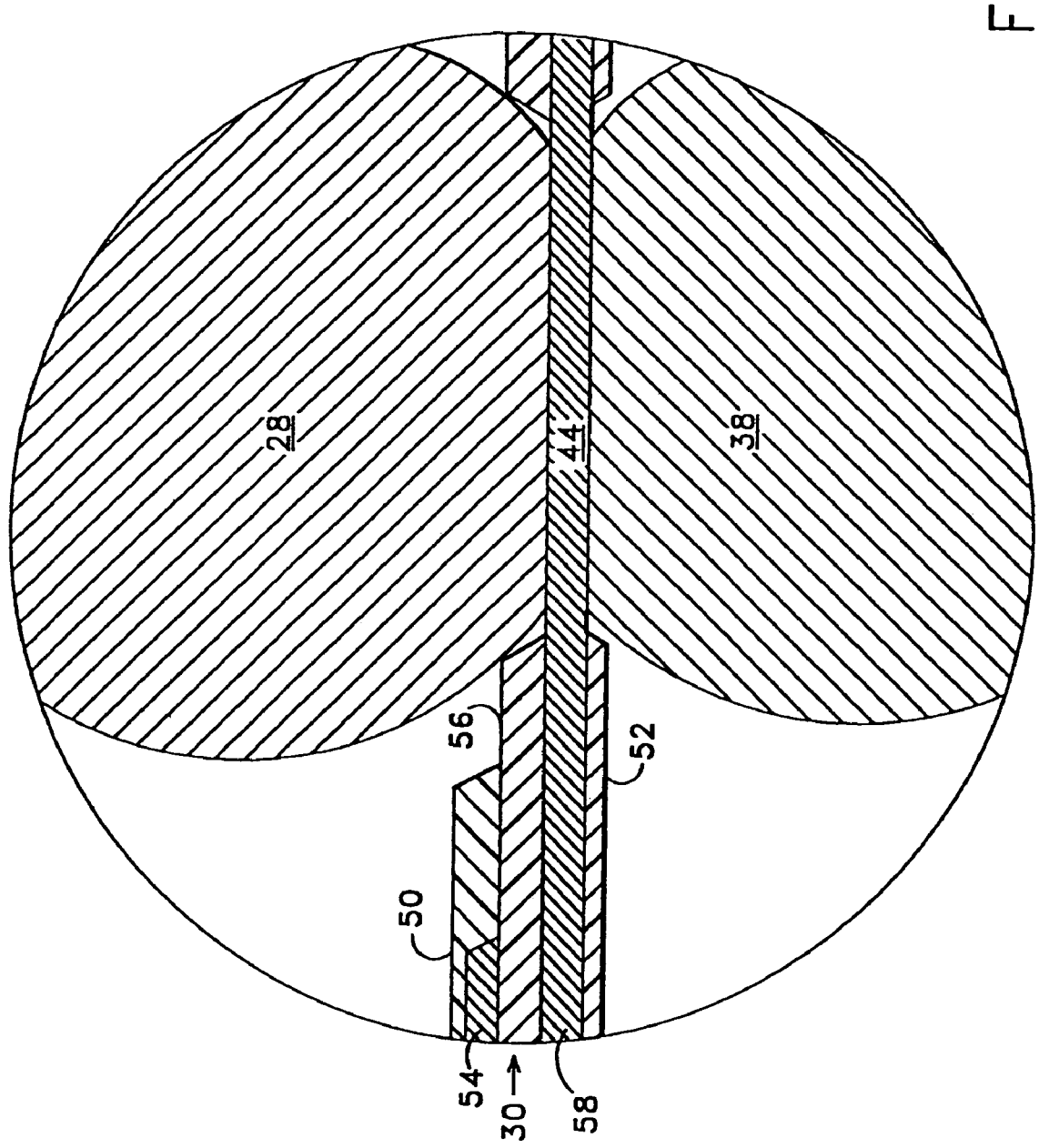
FIG. 4 depicts in enlarged view, the area marked "B" in FIG. 2.

FIG. 4 illustrates the connection between example contact 28 and module contact 38 through a lower flex contact 44 to illustrate a preferred solid metal path from level one CSP 18 to module contact 38 and, therefore, to an application PWB or memory expansion board to which the module is connectable. As those of skill in the art will understand, heat transference from module 10 is thereby encouraged.

Flex 30 is shown in FIG. 4 to be comprised of multiple layers. This is merely an exemplar flexible circuitry that may be employed with the present invention. Single conductive layer and other variations on the described flexible circuitry may, as those of skill will recognize, be employed to advantage in the present invention. Flex 30 has a first outer surface 50 and a second outer surface 52. Flex circuit 30 has at least two conductive layers interior to first and second outer surfaces 50 and 52. There may be more than two conductive layers in flex 30 and flex 32. In the depicted preferred embodiment, first conductive layer 54 and second conductive layer 58 are interior to first and second outer surfaces 50 and 52. Intermediate layer 56 lies between first conductive layer 54 and second conductive layer 58. There may be more than one intermediate layer, but one intermediate layer of polyimide is preferred.

As depicted in FIG. 4 and seen in more detail in figures found in U.S. application Ser. No. 10/005,581 which has been incorporated by reference, lower flex contact 44 is preferably comprised from metal at the level of second conductive layer 58 interior to second outer surface 52.

Figure 5:
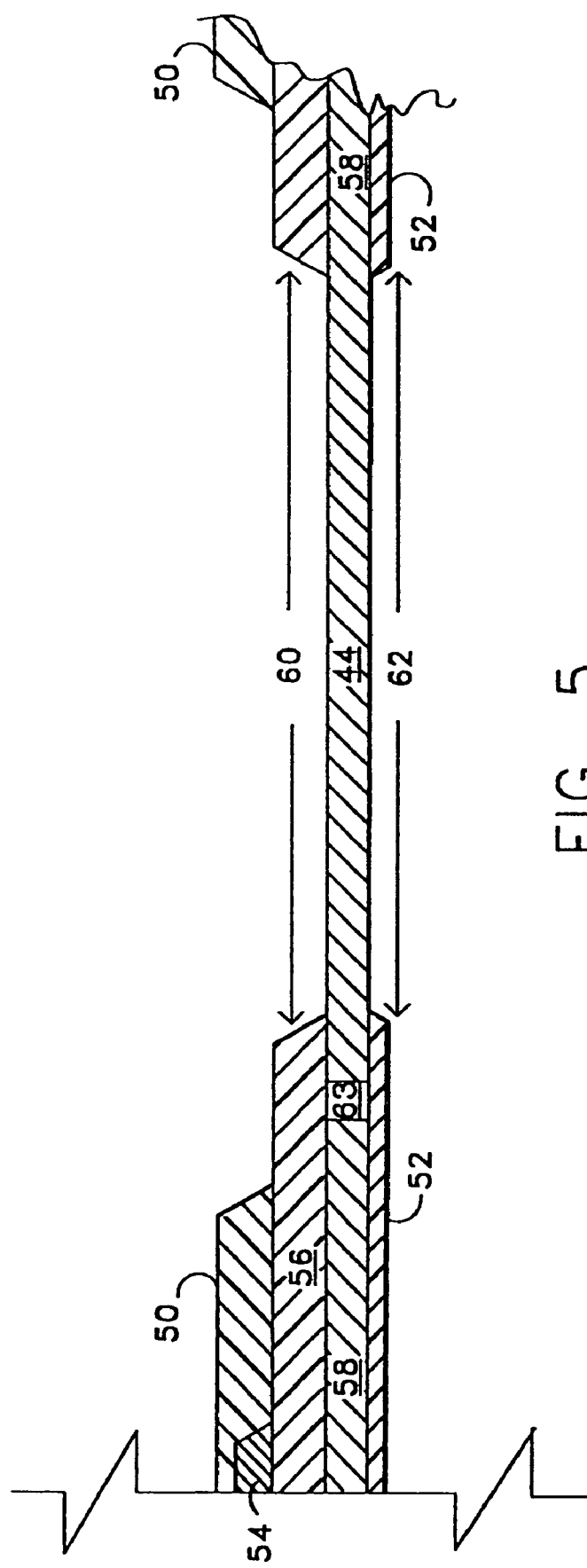
FIG. 5 is an enlarged depiction of an exemplar connection in stacked module devised in accordance with a preferred embodiment.

FIG. 5 is an enlarged depiction of an exemplar area around a lower flex contact 44 in a preferred embodiment. Windows 60 and 62 are opened in first and second outer surface layers 50 and 52 respectively, to provide access to particular lower flex contacts 44 residing at the level of second conductive layer 58 in the flex. In a two-high embodiment of module 10, the upper flex contacts 42 are contacted by contacts 28 of second level CSP 16. Lower flex contacts 44 and upper flex contacts 42 are particular areas of conductive material (preferably metal such as alloy 110) at the level of second conductive layer 58 in the flex. Upper flex contacts 42 and lower flex contacts 44 are demarked in second conductive layer 58 and, as will be shown in subsequent FIGS., may be connected to or isolated from the conductive plane of second conductive layer 58. Demarking a lower flex contact 44 from second conductive layer 58 is represented in FIG. 5 by demarcation gap 63 shown at second conductive layer 58. Where an upper or lower flex contact 42 or 44 is not completely isolated from second conductive layer 58, demarcation gaps do not extend completely around the flex contact. Contacts 28 of first level CSP 18 pass through a window 60 opened through first outer surface layer 50, first conductive layer 54, and intermediate layer 56, to contact an appropriate lower flex contact 44. Window 62 is opened through second outer surface layer 52 through which module contacts 36 pass to contact the appropriate lower flex contact 44.

Respective ones of contacts 28 of second level CSP 16 and first level CSP 18 are connected at the second conductive layer 58 level in flex circuits 30 and 32 to interconnect appropriate signal and voltage contacts of the two CSPs. In a preferred embodiment, respective contacts 28 of second level CSP 16 and first level CSP 18 that convey ground (VSS) signals are connected at the first conductive layer 54 level in flex circuits 30 and 32 by vias that pass through intermediate layer 56 to connect the levels as will subsequently be described in further detail. Thereby, CSPs 16 and 18 are connected. Consequently, when flex circuits 30 and 32 are in place about first level CSP 18, respective contacts 28 of each of CSPs 16 and 18 are in contact with upper and lower flex contacts 42 and 44, respectively. Selected ones of upper flex contacts 42 and lower flex contacts 44 are connected. Consequently, by being in contact with lower flex contacts 44, module contacts 38 are in contact with both CSPs 16 and 18.

In a preferred embodiment, module contacts 38 pass through windows 62 opened in second outer layer 52 to contact lower CSP contacts 44. In some embodiments, as is shown in incorporated U.S. application Ser. No. 10/005,581, module 10 will exhibit a module contact array that has a greater number of contacts than do the constituent CSPs of module 10. In such embodiments, some of module contacts 38 may contact lower flex contacts 44 that do not contact one of the contacts 28 of first level CSP 18 but are connected to contacts 28 of second level CSP 16. This allows module 10 to express a wider datapath than that expressed by the constituent CSPs 16 or 18. A module contact 38 may also be in contact with a lower flex contact 44 to provide a location through which different levels of CSPs in the module may be enabled when no unused CSP contacts are available or convenient for that purpose.

In a preferred embodiment, first conductive layer 54 is employed as a ground plane, while second conductive layer 58 provides the functions of being a signal conduction layer and a voltage conduction layer. Those of skill will note that roles of the first and second conductive layers may be reversed with attendant changes in windowing and use of commensurate interconnections.

Figure 6:
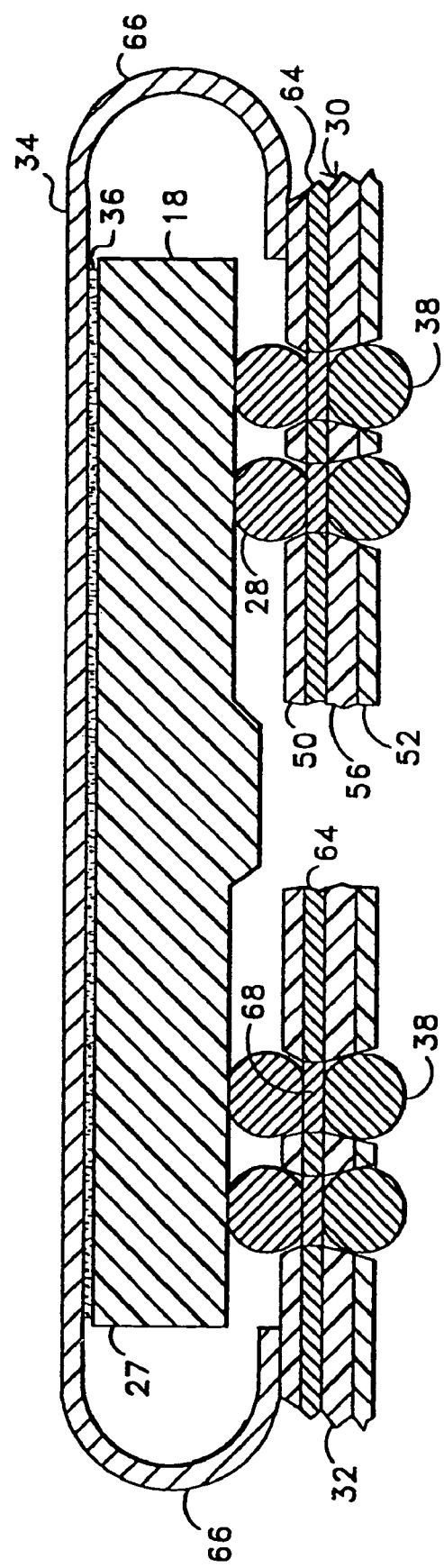
FIG. 6 depicts a flexible circuit connective set of flex circuits that has a single conductive layer.

FIG. 6 depicts a flexible circuit connective set of flex circuits 30 and 32 that has a single conductive layer 64. It should be understood with reference to FIG. 6 that flex circuits 30 and 32 extend further than shown and have portions which are, in the construction of module 10 brought about the curvature areas 66 of form standard 34 that mark the lateral extent of this example of a preferred form standard and are then disposed above the body of CSP 18 or the respective CSP of the module and therefore, the form standard. In this single conductive layer flex embodiment of module 10, there are shown first and second outer layers 50 and 52 and intermediate layer 56. Also shown in FIG. 6 are a set of single layer lower flex contacts 68 demarked at the level of conductive layer 64.

Form standard 34 is shown attached to the body 27 of first level CSP 18 through an adhesive. In some embodiments, it may also be positioned to directly contact body 27 of the respective CSP. Form standard 34 may take many different configurations to allow a connective flex circuitry to be prepared exhibiting a single set of dimensions which may, when used in conjunction with form standard 34, be employed to create stacked modules 10 from CSPs of a variety of different dimensions. In a preferred embodiment, form standard 34 will present a lateral extent broader than the upper major surface of the CSP over which it is disposed. Thus, the CSPs from one manufacturer may be aggregated into a stacked module 10 with the same flex circuitry used to aggregate CSPs from another manufacturer into a different stacked module 10 despite the CSPs from the two different manufacturers having different dimensions.

Further, heat transference can be improved with use of a form standard 34 comprised of heat transference material such as a metal or preferably, copper or a copper compound or alloy to provide a significant sink for thermal energy. Such thermal enhancement of module 10 particularly presents opportunities for improvement of thermal performance where larger numbers of CSPs are aggregated in a single stacked module 10.

Figure 7:
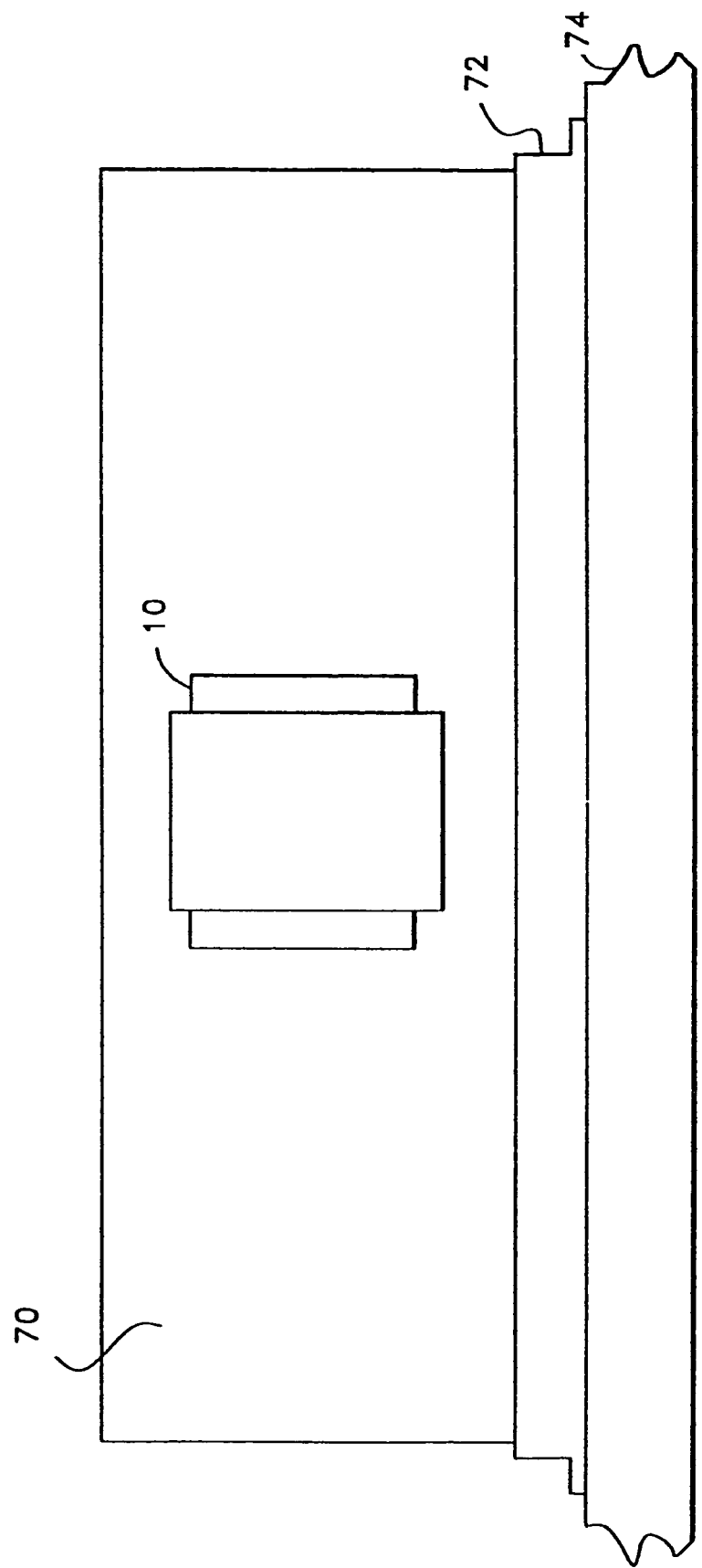
FIG. 7 depicts a four-high stacked module mounted on a memory expansion board in accordance with a preferred embodiment of the present invention.

FIG. 7 depicts a four-high stacked module 10 mounted on a memory expansion board 70 in accordance with a preferred embodiment of the present invention. As do typical DIMM boards, expansion board 70 shown in FIG. 7 has a set of contacts along one edge that as depicted are set in socket connector 72. Those contacts connect module 10 to a logic system on or connected to board 74 on which expansion board 70 is mounted. It should be understood that in a preferred embodiment of the memory expansion system and method provided herein, expansion board 70 will be populated with nine such modules 10 per side for a total of 72 devices if the stacked modules are each comprised from four devices.

Figure 8:
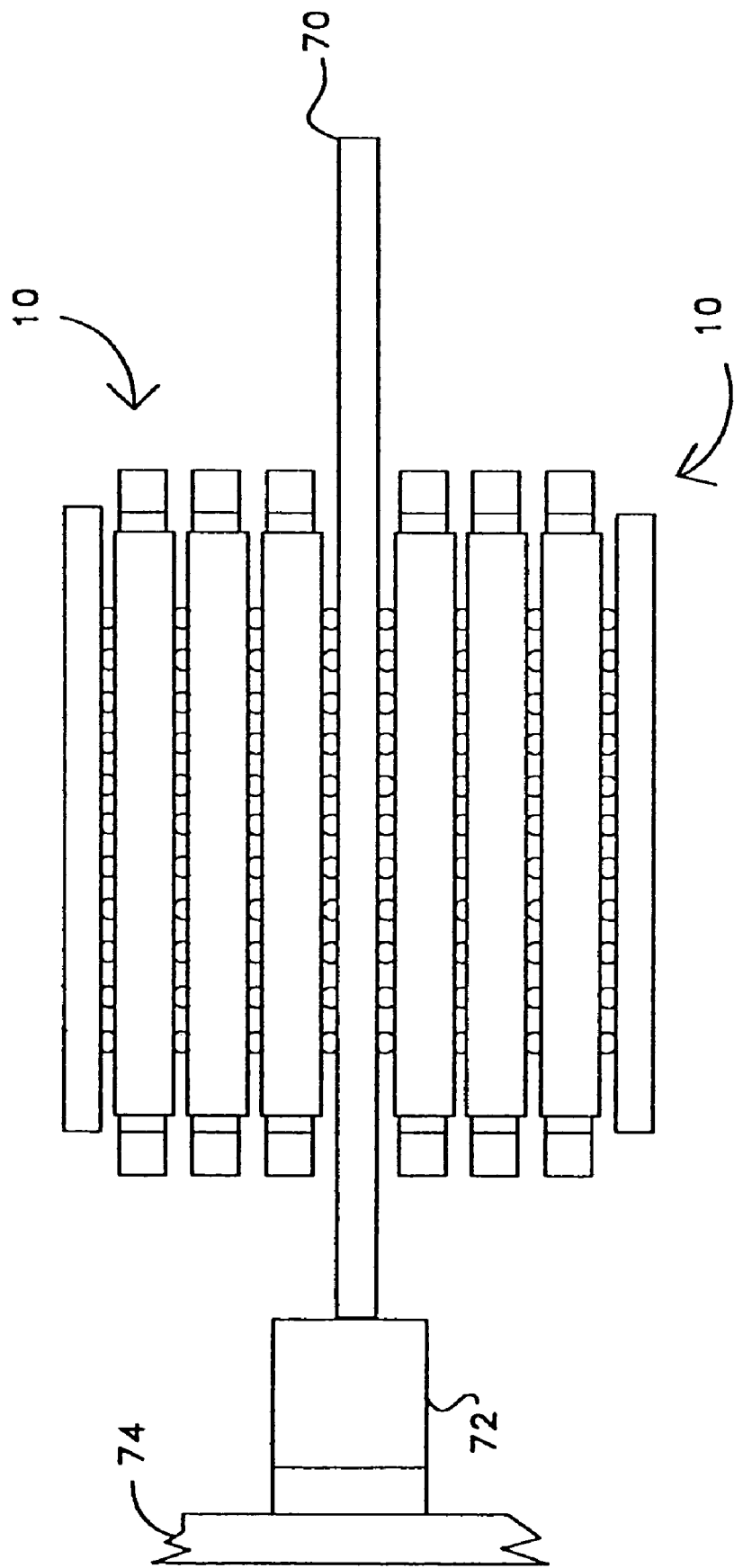
FIG. 8 depicts a memory expansion board or DIMM mounted with four-high modules.

FIG. 8 depicts memory expansion board 70 mounted with four-high modules 10. As those of skill will recognize, using four-high stacked modules on expansion board 70 reduces the interconnect length for the number of devices accessed but increase the total number of devices and, therefore, the impedance and particularly, the capacitive loading presented by a densely populated DIMM board.

Figure 9:
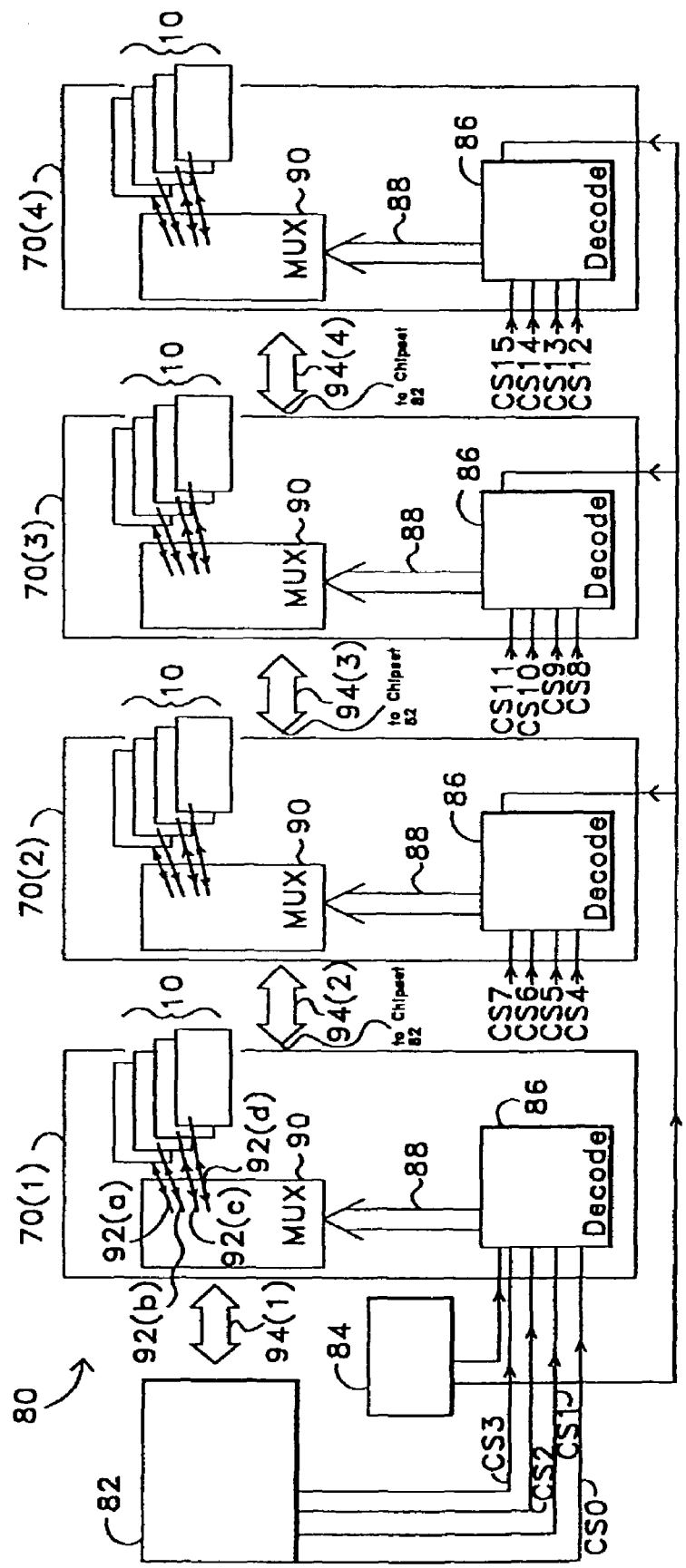
FIG. 9 depicts a memory system devised in accordance with the present invention.

FIG. 9 depicts a memory system 80 devised in accordance with the present invention. In a preferred mode, system 80 is employed with stacked modules 10 devised in accordance with the present invention. The preferred embodiment is for a DDRII registered DIMM populated with 4 high stacked modules 10 although it may be employed with an equivalent number of DRAMs, i.e., 72 evices of either leaded or CSP packaging aggregated in stacks of any number of levels.

Chipset 82 depicted in FIG. 9 typically includes a microprocessor or memory controller that controls the memory access with system 80. Clock 84 is provided to decode logic 86 on each of depicted memory expansion boards $70_{(1)}$, $70_{(2)}$, $70_{(3)}$, and $70_{(4)}$. Those of skill will understand that system 80 and its methods may be employed with one or more DIMMs or other memory expansion boards 70. It may also be employed off a memory expansion board to access separately, the integrated circuits from which stacked circuit modules are comprised. Decode logic 86 on each of memory expansion boards $70_{(1)}$, $70_{(2)}$, $70_{(3)}$, and $70_{(4)}$ provides a decoding of the respective CS signals provided to the respective memory expansion boards 70 as shown in FIG. 9. As those of skill will understand, the particular interconnection employed in the system should preferably be devised to minimize and balance power consumption across the circuit modules employed in the system.

As shown in the example depicted in FIG. 9, CS0, CS1, CS2, and CS3 are provided to memory expansion board $70_{(1)}$ from chipset 82 while CS4, CS5, CS6, and CS7 are provided to memory expansion board $70_{(2)}$ as are CS8, CS9, CS10, and CS11 provided to memory expansion board 70(3) and CS12, CS13, CS14, and CS15 are provided to memory expansion board 70(4).

In a preferred embodiment, memory expansion boards 70 are populated with nine four high CSP modules 10 per side. The depiction of FIG. 9 shows, however, only one module 10 per memory expansion board 70 to preserve clarity of the view. The shown module 10 is exploded to depict the four levels of module 10 which, in a preferred construction of module 10 include CSPs 18, 16, 14, and 12 with the form standard 34. However, those of skill will recognize that modules employed with system 80 need not have four levels and need not be CSP devices although that is preferred.

Thus, decode logic 86 may, on the appropriate signal from clock 84, generate a level select signal which, in a preferred embodiment, is a multi-bit signal that controls a multiplexing switch 90 associated with several data lines. Switch 90 is in a preferred embodiment, a high speed switch and a FET multiplexer would provide a preferred multiplexing switch 90 in the practice of a preferred mode of the invention. The fan out of multiplexing switch 90 may be any that provides a selection capability to a variety of device data lines from a DQ line from chipset 82. The DQ lines between chipset 82 and switches 90 are depicted by double-headed arrows 94(1), 94(2), 94(3) and 94(4). As with the depiction of stacked modules 10, only one multiplexing switch 90 is shown per memory expansion board 70, but those of skill will understand that multiple multiplexing switches 90 are employed in practice of the depicted preferred embodiment of the invention. The number of multiplexing switches 90 will depend upon the fan out ratios. For example, use of nine 8:32 multiplexing switches 90 would be preferred (if available) or 4:8 or 1:4 multiplexing switches 90 will also provide advantages as an example. It should be understood that there are merely examples and that a variety of multiplexing switches and ratios may be employed for multiplexing switches 90 although the type of switch and the ratios will affect the loading figures. Consequently, a FET mux is preferred for multiplexing switch 90 and a ratio of 1:4 is one of the preferred ratios to employ.

The depiction in FIG. 9 is illustrative only and not meant to be limiting. For example, a single DIMM board or expansion board 70 may be employed in a system 80 in accordance with the present invention as well as larger numbers of expansion boards 70. The number of expansion boards 70 that may function in system 80 is partially a function of the access speeds required and the signal conformity.

An exemplar multiplexing switch 90 has multiple inputs 92(a), 92(b), 92(c), and 92(d) to provide independent data lines for each level of an exemplar module 10 populated upon the respective memory expansion board 70. Thus, with a 1:4 switch 90, there will be 18 iterations of multiplexing switch 90, one for each of the 18 four-high module 10's populating memory expansion board 70(1). Thus, the system 80 shown in FIG. 9 presents a total of 288 memory devices. It should be noted that system 80 may be employed with ICs of any package type and need not be limited to DDR or DDRII or even CSP.

The data line of each level of the constituent CSPs of each module 10 is connected to one input 92 of a corresponding exemplar multiplexing switch 90. In response to the CS signal 88 from decode logic 86 on a DIMM expansion board 70, multiplexing switch 90 connects the appropriate one of the DQ signals 94 to one of the four levels of a module 10 on that memory expansion board 70. This switching of the data bus through multiplexing switch 90 may, in some systems, required further control signal connections as those of skill in the art will recognize to accommodate the data latency of one or more clocks cycles, CAS latency, and burst length, for example. In a preferred mode, expansion board 70 may keep all the constituent devices of the modules 10 as if each constituent device of the modules 10 were the target, instead of having to switch terminations each time a different CS is chosen. In some applications it may be preferred to terminate the end of the data line past the last DIMM expansion board 70. Other features may enable improvements to the efficiency of system 80 such as creating more CS banks by decoding the chip select lines.

In the system 80, the capacitive load presented to chipset 82 would be approximately the combination of the input capacitance of switching multiplexer 90 times the number of DIMM slots plus one DRAM device load plus one times the output capacitance of the multiplexing switch 90. In large systems, this will reduce capacitive loading by a notable amount, thus allowing more DIMM slots at higher speeds and/or more densely populated DIMMs. Memory access system 80 provides an opportunity to improve high speed memory performance and allows use of memory expansion configurations that might not otherwise be available due to capacitive loading in conventional DIMM systems.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A memory access system comprising:
a memory expansion board;
a high-density circuit module mounted on the memory expansion board and comprising:
a first CSP having an upper and a lower major surface and a set of CSP contacts along the lower major surface;
a second CSP having first and second lateral edges and upper and lower major surfaces and a set of CSP contacts along the lower major surface, the first and second lateral edges delineating an extent of the upper major surface of the second CSP and the first CSP being disposed above the second CSP;
flex circuitry connecting the first and second CSPs; and
a substantially rigid form standard having an extent greater than the extent of the upper major surface of the second CSP and disposed so as to extend between the first and second CSPs and beyond the extent of the upper major surface of the second CSP;
a switching multiplexer mounted on the memory expansion board, the switching multiplexer being controlled by a switching multiplexer control signal to connect a DQ signal to either the first CSP or the second CSP; and
a decode logic circuit for decoding chip selection signals from a control circuit and providing the switching multiplexer control signal.

2. A memory access system comprising:
a high-density circuit module comprising:
a first CSP having an upper and a lower major surface and a set of CSP contacts along the lower major surface;
a second CSP having first and second lateral edges and upper and lower major surfaces and a set of CSP contacts along the lower major surface, the first and second lateral edges delineating an extent of the upper major surface of the second CSP and the first CSP being disposed above the second CSP;

flex circuitry connecting the first and second CSPs; and a substantially rigid form standard having an extent greater than the extent of the upper major surface of the second CSP and disposed so as to extend between the first and second CSPs and beyond the extent of the upper major surface of the second CSP;

a switch controlled by a control signal for connecting a DQ signal to a selected one of the first and second CSPs of the high-density circuit module;

a decode logic for generating the control signal that causes the switch to connect the DQ signal to the selected one of the first and second CSPs in response to a combination signal comprised of a clock signal and a chip select signal.

3. The memory access system of claim 2 in which the high-density circuit module comprises four CSPs.

4. A memory access system comprising:

plural memory expansion boards each populated with plural high-density circuit modules, each of which plural high-density circuit modules comprise:

a first CSP having an upper and a lower major surface and a set of CSP contacts along the lower major surface;

a second CSP having first and second lateral edges and upper and lower major surfaces and a set of CSP contacts along the lower major surface, the first and second lateral edges delineating an extent of the upper major surface of the second CSP and the first CSP being disposed above the second CSP;

flex circuitry connecting the first and second CSPs; and a substantially rigid form standard having an extent greater than the extent of the upper major surface of the second CSP and disposed so as to extend between the first and second CSPs and beyond the extent of the upper major surface of the second CSP;

plural multiplexers mounted upon each of the plural memory expansion boards, each one of the plural multiplexers corresponding to a selected one of the plural high-density circuit modules, each one of the plural multiplexers for making connections between a DQ signal and a selected single one of the CSPs comprising the high-density circuit module to which the selected one of the plural multiplexers corresponds;

decode logic on each of the plural memory expansion boards, the decode logic for generating a control signal in response to a combination signal comprised of a clock signal and a chip select signal, the control signal causing at least one of the plural multiplexers to connect the DQ signal to a particular one of the CSPs.

5. The memory access system of claim 4 in which the multiplexers are FET multiplexers.

6. The memory access system of claim 4 in which the form standard presents at least one surface for contact with flex circuitry, the flex circuitry connecting the first and second CSPs and disposed to place a first portion of the flex circuitry beneath the lower major surface of the first CSP and a second portion of the flex circuitry above the form standard disposed between the first and second CSPs.

7. The memory access system of claim 4 in which the plural high-density circuit modules are comprised of four CSPs.

8. The memory access system of claim 4 in which the plural high-density circuit modules are comprised of two CSPs.

9. A memory access system comprising:

a memory board mounted with a high-density circuit module comprised of first, second, third, and fourth stacked individual CSPs;

a switching multiplexer mounted on the memory board, which switching multiplexer provides selective individual connection of a DQ signal to a selected one of the first, second, third, and fourth stacked individual CSPs so that only one of the first, second, third or fourth stacked individual CSPs is connected to the DQ signal at a time; and a decode logic circuit for decoding chip selection signals from a control circuit and providing a switching multiplexer control signal.

10. The memory access system of claim 9 in which the individual connection between the DQ signal and a selected one of the first, second, third, or fourth stacked individual CSPs occurs in response to the switching multiplexer control signal from the decode logic circuit.

11. The memory access system of claim 9 in which the decode logic circuit is mounted on the memory board.

12. The memory access system of claim 9 in which the high-density memory module is comprised of:

a first CSP having upper and lower major surfaces and a first and a second edge, the edges delineating a lateral extent for the upper major surface;

a second CSP;

a substantially rigid form standard disposed between the first and second CSPs, the form standard having a lateral extent greater than the lateral extent of the upper major surface of the first CSPs, the form standard presenting at least one surface for contact with flex circuitry, the flex circuitry connecting the first and second CSPs and disposed to place a first portion of the flex circuitry beneath the lower major surface of the first CSP and a second portion of the flex circuitry above the form standard disposed between the first and second CSPs.

* * * * *